US008716095B2

(12) United States Patent
Zhong et al.

(10) Patent No.: US 8,716,095 B2
(45) Date of Patent: May 6, 2014

(54) MANUFACTURING METHOD OF GATE STACK AND SEMICONDUCTOR DEVICE

(75) Inventors: Huicai Zhong, Beijing (CN); Zhijiong Luo, Poughkeepsie, NY (US); Qingqing Liang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 598 days.

(21) Appl. No.: 12/997,625

(22) PCT Filed: Sep. 19, 2010

(86) PCT No.: PCT/CN2010/001437
§ 371 (c)(1), (2), (4) Date: Dec. 13, 2010

(87) PCT Pub. No.: WO2011/150539
PCT Pub. Date: Dec. 8, 2011

(65) Prior Publication Data

US 2011/0298053 A1 Dec. 8, 2011

(30) Foreign Application Priority Data

Jun. 3, 2010 (CN) .......................... 2010 1 0197080

(51) Int. Cl.
*H01L 21/336* (2006.01)
*H01L 29/78* (2006.01)

(52) U.S. Cl.
USPC ........... 438/304; 438/183; 438/596; 257/288; 257/E21.626; 257/E21.205

(58) Field of Classification Search
USPC ......... 438/183, 267, 303–304, 595–596, 639, 438/696; 257/E21.626, E21.64, E21.205, 257/E21.434, E21.444, E21.453
See application file for complete search history.

(56) References Cited

U.S. PATENT DOCUMENTS 6,087,231 A 7/2000 Xiang et al.
6,177,303 B1 1/2001 Schmitz et al.

(Continued)

FOREIGN PATENT DOCUMENTS

CN 1296639 A 5/2001
CN 101263594 A 9/2008
CN 101656214 A 2/2010

OTHER PUBLICATIONS

2nd Office Action issued Jul. 12, 2013, by the State Intellectual Property Office of the People's Republic of China, in related Chinese Patent Application No. 201010197080.6, with an English translation (20 pages).

(Continued)

*Primary Examiner* — Laura Menz
*Assistant Examiner* — Maliheh Malek
(74) *Attorney, Agent, or Firm* — Osha Liang LLP

(57) ABSTRACT

A manufacturing method of a gate stack with sacrificial oxygen-scavenging metal spacers includes: forming a gate stack structure consisting of an interfacial oxide layer, a high-K dielectric layer and a metal gate electrode, on a semiconductor substrate; conformally depositing a metal layer covering the semiconductor substrate and the gate stack structure; and selectively etching the metal layer to remove the portions of the metal layer covering the top surface of the gate stack structure and the semiconductor substrate, so as to only keep the sacrificial oxygen-scavenging metal spacers surrounding the gate stack structure in the outer periphery of the gate stack structure. A semiconductor device manufactured by this process.

6 Claims, 8 Drawing Sheets

(56) References Cited

U.S. PATENT DOCUMENTS

| | | | | |
|---|---|---|---|---|
| 7,220,635 | B2 * | 5/2007 | Brask et al. | 438/216 |
| 7,226,831 | B1 * | 6/2007 | Metz et al. | 438/216 |
| 7,378,713 | B2 | 5/2008 | Hsu et al. | |
| 7,553,709 | B2 * | 6/2009 | Zhu et al. | 438/149 |
| 7,682,917 | B2 * | 3/2010 | Bedell et al. | 438/304 |
| 7,888,195 | B2 * | 2/2011 | Lin et al. | 438/199 |
| 7,989,902 | B2 * | 8/2011 | Ando et al. | 257/410 |
| 8,252,675 | B2 * | 8/2012 | Lee et al. | 438/592 |
| 8,367,496 | B2 * | 2/2013 | Ando et al. | 438/216 |
| 8,420,492 | B2 * | 4/2013 | Zhong et al. | 438/303 |
| 8,597,995 | B2 * | 12/2013 | Xu | 438/216 |
| 2003/0235990 | A1 * | 12/2003 | Wu | 438/694 |
| 2004/0157397 | A1 * | 8/2004 | Quek | 438/305 |
| 2005/0090066 | A1 * | 4/2005 | Zhu et al. | 438/300 |
| 2005/0153530 | A1 * | 7/2005 | Ku et al. | 438/587 |
| 2005/0272191 | A1 * | 12/2005 | Shah et al. | 438/197 |
| 2006/0073666 | A1 * | 4/2006 | Lim et al. | 438/303 |
| 2007/0145498 | A1 * | 6/2007 | Metz et al. | 257/410 |
| 2009/0057786 | A1 | 3/2009 | Fukasaku | |
| 2009/0179283 | A1 * | 7/2009 | Adams et al. | 257/411 |
| 2009/0186455 | A1 * | 7/2009 | Bedell et al. | 438/199 |
| 2009/0212371 | A1 | 8/2009 | Kobayashi | |
| 2009/0302389 | A1 | 12/2009 | Lander et al. | |
| 2010/0038705 | A1 * | 2/2010 | Doris et al. | 257/327 |
| 2010/0044806 | A1 | 2/2010 | Hou et al. | |
| 2010/0320547 | A1 * | 12/2010 | Ando et al. | 257/411 |
| 2011/0189847 | A1 * | 8/2011 | Tsai et al. | 438/595 |
| 2011/0207280 | A1 * | 8/2011 | Ando et al. | 438/287 |
| 2011/0227160 | A1 * | 9/2011 | Liang et al. | 257/356 |
| 2011/0254098 | A1 * | 10/2011 | Wong et al. | 257/369 |
| 2011/0298018 | A1 * | 12/2011 | Yin et al. | 257/288 |
| 2012/0018810 | A1 * | 1/2012 | Chambers et al. | 257/369 |
| 2012/0061738 | A1 * | 3/2012 | Yin et al. | 257/288 |
| 2012/0098043 | A1 * | 4/2012 | Hsieh et al. | 257/288 |
| 2012/0168829 | A1 * | 7/2012 | Zhong et al. | 257/288 |
| 2012/0181617 | A1 * | 7/2012 | Luo et al. | 257/369 |
| 2012/0223399 | A1 * | 9/2012 | Carter et al. | 257/412 |

OTHER PUBLICATIONS

PCT International Preliminary Report on Patentability (IPRP) issued Dec. 4, 2012, by The International Bureau of WIPO, in related International Application No. PCT/CN2010/001437 (15 pages).

* cited by examiner

MANUFACTURING METHOD OF GATE STACK AND SEMICONDUCTOR DEVICE

BACKGROUND OF THE INVENTION

1. Field of the Invention

The invention relates to the technology of semiconductor, and particularly to a semiconductor device and a manufacturing method of the same. More particularly, it relates to a manufacturing method of a gate stack with sacrificial oxygen-scavenging metal spacers, and a semiconductor device with a gate stack structure manufactured by the method.

2. Description of the Prior Art

Conventional Complementary Metal Oxide Semiconductor Field Effect Transistor (CMOSFET) manufacturing process comprises Gate-First process and Gate-Last process. High-dielectric-constant (high-K) dielectric/metal gate electrode stacks with Low equivalent oxide thickness (EOT) are widely used in 32 nm technology node and beyond. An interfacial layer between the high-K dielectric and the substrate channel (usually a semiconductor substrate) makes it very difficult to achieve EOT<1 nm, because the interfacial layer itself could account for about 4 Å thickness. In the conventional CMOSFET process, a sacrificial metal layer such as Ta, Ti and the like between the high-K dielectric and the metal gate electrode has been used to scavenge the oxygen within the dielectric film. The gate stack structure with low EOT has been achieved using this method.

FIG. 1 shows a schematic view of the semiconductor device manufactured by the conventional Gate-First process. As shown in FIG. 1, the semiconductor device manufactured by the conventional process mainly comprises: a semiconductor substrate 100, a shallow trench isolation (STI) 110, an interfacial oxide layer 120, a high-K dielectric layer 130, a sacrificial oxygen-scavenging metal layer 140, and a metal gate electrode 150. The STI 110 is formed in the semiconductor substrate 100 for isolation between devices. The interfacial oxide layer 120 is formed on the semiconductor substrate 100. The high-K dielectric layer 130 is formed on the interfacial oxide layer 120. The sacrificial oxygen-scavenging metal layer 140 is formed on the high-K dielectric layer 130. The metal gate electrode 150 is formed on the sacrificial oxygen-scavenging metal layer 140. Thereby, the interfacial oxide layer 120, the high-K dielectric layer 130, the sacrificial oxygen-scavenging metal layer 140, and the metal gate electrode 150 form the gate stack structure of the semiconductor device. In the semiconductor device shown in FIG. 1, the sacrificial oxygen-scavenging metal layer 140 is between the high-K dielectric layer 130 and the metal gate electrode 150. After annealing and/or other processing steps, the sacrificial oxygen-scavenging metal layer 140 will scavenge the oxygen in the high-K dielectric layer 130 and convert to metal oxide dielectric. The purpose of disposing the sacrificial oxygen-scavenging metal layer 140 is to consume the oxygen in the gate stack structure, thus reducing the oxygen to be consumed by the substrate. In this way, the EOT could be minimized.

However, both the Gate-First process and the Gate-Last process as the conventional CMOSFET manufacturing process have the following disadvantages:

1. The sacrificial metal layer (the sacrificial oxygen-scavenging metal layer 140) becomes a metal oxide layer (dielectric layer) after the oxygen within the dielectric layer (the high-K dielectric layer 130) is scavenged by the sacrificial metal layer. This converted dielectric layer will be accounted for the new EOT increase and thereby small EOT is hard to achieve.

2. The sacrificial metal layer might not be fully converted into metal oxide dielectric (dielectric layer) if, for example, oxygen is not enough for the complete conversion of the sacrificial metal layer. This could result in thickness variation for the metal oxide (dielectric layer), and thereby variation of work functions for different devices.

SUMMARY OF THE INVENTION

To address the above disadvantages of the conventional process, the present invention provides a manufacturing method of a gate stack with sacrificial oxygen-scavenging metal spacers, wherein the sacrificial oxygen-scavenging metal spacers are used to replace the sacrificial metal layer and is arranged along the sidewalls of the gate stack structure to act as the sacrificial oxygen-scavenging metal spacer. The manufacturing method of the gate stack structure of the present invention can be applied to both the Gate-first process and the Gate-Last process. The present invention further provides a semiconductor device with a gate manufactured by this method.

A first solution of the present invention provides a manufacturing method of a gate stack with sacrificial oxygen-scavenging metal spacers, comprising: forming a gate stack structure consisting of an interfacial oxide layer, a high-K dielectric layer and a metal gate electrode, on a semiconductor substrate; conformally depositing a metal layer covering the semiconductor substrate and the gate stack structure; and selectively etching the metal layer to remove the portions of the metal layer covering the top surface of the gate stack structure and the semiconductor substrate, so as to only keep the sacrificial oxygen-scavenging metal spacers surrounding the gate stack structure in the outer periphery of the gate stack structure.

Preferably, the manufacturing method of a gate stack with sacrificial oxygen-scavenging metal spacers according to the first solution of the present invention further comprises: conformally depositing a dielectric layer covering the top surface of the gate stack structure, the top surfaces of the sacrificial oxygen-scavenging metal spacers and the semiconductor substrate; and selectively etching the dielectric layer to remove the dielectric layer covering the top surface of the gate stack structure, the top surfaces of the sacrificial oxygen-scavenging metal spacers and the semiconductor substrate, and only keeping dielectric spacers surrounding the sacrificial oxygen-scavenging metal spacers in the outer periphery of the sacrificial oxygen-scavenging metal spacers.

Preferably, the manufacturing method of a gate stack with sacrificial oxygen-scavenging metal spacers according to the first solution of the present invention further comprises after conformally depositing the metal layer and before selectively etching the metal layer: conformally depositing a dielectric layer covering the metal layer; and selectively etching the dielectric layer to remove the dielectric layer covering the top surface of the metal layer, and only keeping dielectric spacers surrounding the sacrificial oxygen-scavenging metal spacers in the cuter periphery of the sacrificial oxygen-scavenging metal spacers.

Preferably, the manufacturing method of a gate stack with sacrificial oxygen-scavenging metal spacers according to the first solution of the present invention further comprises one of the following steps: entirely or partially removing the sacrificial oxygen-scavenging metal spacers after oxygen-scavenging process; and entirely or partially removing the sacrificial oxygen-scavenging metal spacers and the dielectric spacers after oxygen-scavenging process.

A second solution of the present invention provides a manufacturing method of a gate stack with sacrificial oxygen-scavenging metal spacers, comprising: removing a replacement gate stack formed in an inter-device isolation dielectric layer to expose the top surface of a semiconductor substrate and sidewalls of spacers within the inter-device isolation dielectric layer; conformally depositing a metal layer covering the inter-device isolation dielectric layer and the semiconductor substrate; selectively etching the metal layer to remove the portions of the metal layer covering the inter-device isolation dielectric layer and the semiconductor substrate, and only keeping sacrificial oxygen-scavenging metal spacers in the inner periphery of the spacers; and sequentially forming an interfacial oxide layer, a high-K dielectric layer, and a metal gate electrode on the semiconductor substrate filling the space between the sacrificial oxygen-scavenging metal spacers, so as to form a gate stack structure.

A third solution of the present invention provides a manufacturing method of a gate stack with sacrificial oxygen-scavenging metal spacers, comprising: removing a replacement gate stack formed in an inter-device isolation dielectric layer to expose the top of a semiconductor substrate and sidewalls of spacers in the inter-device isolation dielectric layer; conformally depositing a dielectric layer covering the inter-device isolation dielectric layer and the semiconductor substrate; conformally depositing a metal layer covering the dielectric layer; selectively etching the metal layer and the dielectric layer sequentially to remove the metal layer and the dielectric layer covering the inter-device isolation dielectric layer and the semiconductor substrate, so as to only keep dielectric spacers in the inner periphery of the spacers and sacrificial oxygen-scavenging metal spacers in the inner periphery of the dielectric spacers; and sequentially forming an interfacial oxide layer, a high-K dielectric layer, and a metal gate electrode filling the space between the sacrificial oxygen-scavenging metal spacers on the semiconductor substrate.

Preferably, the manufacturing method of a gate stack with sacrificial oxygen-scavenging metal spacers according to the second or third solution of the present invention further comprises one of the following steps: entirely or partially removing the high-K dielectric spacers and the sacrificial oxygen-scavenging metal spacers after oxygen-scavenging process; entirely or partially removing the high-K dielectric spacers, the sacrificial oxygen-scavenging metal spacers, and the dielectric spacers after oxygen-scavenging process; and entirely or partially removing the high-K dielectric spacers, the sacrificial oxygen-scavenging metal spacers, the dielectric spacers, and the spacers after oxygen-scavenging process.

Preferably, the sacrificial oxygen-scavenging metal spacers are formed of Ta, Hf, or Ti; and/or the dielectric spacers are formed of $SiO_2$, $Si_3N_4$, or SiON.

Preferably, the sacrificial oxygen-scavenging metal spacers have a width of 1-10 nm, and a height of 20-90 nm, and/or the dielectric spacers have a width of 2-50 nm, and a height of 20-90 nm.

Preferably, the sacrificial oxygen-scavenging metal spacers have a simple D-shape section or an L-shape section.

Preferably, the dielectric spacers have an L-shape section.

A fourth solution of the present invention provides a semiconductor device, comprising: a semiconductor substrate; a shallow trench isolation structure formed in the semiconductor substrate; and a gate formed on the semiconductor substrate; wherein, the gate comprises: a gate stack structure consisting of an interfacial oxide layer, a high-K dielectric layer, and a metal gate electrode, wherein the interfacial oxide layer is formed on the semiconductor substrate, the high-K dielectric layer is formed on the interfacial oxide layer, and the metal gate electrode is formed on the high-K dielectric layer; and sacrificial oxygen-scavenging metal spacers formed on the semiconductor substrate surrounding the gate stack structure in the outer periphery of the gate stack structure.

Preferably, according to the fourth solution of the present invention, the gate further comprises dielectric spacers formed on the semiconductor substrate surrounding the sacrificial oxygen-scavenging metal spacers in the outer periphery of the sacrificial oxygen-scavenging metal spacers.

Preferably, according to the fourth solution of the present invention, the gate further comprises dielectric spacers formed on the sacrificial oxygen-scavenging metal spacers surrounding the sacrificial oxygen-scavenging metal spacers in the outer periphery of the sacrificial oxygen-scavenging metal spacers.

Preferably, according to the fourth solution of the present invention, the sacrificial oxygen-scavenging metal spacers are removed entirely or partially after oxygen-scavenging process; or the sacrificial oxygen-scavenging metal spacers and the dielectric spacers are removed entirely or partially after oxygen-scavenging process.

A fifth solution of the present invention provides a semiconductor device, comprising: a semiconductor substrate; a shallow trench isolation structure formed in the semiconductor substrate; an inter-device isolation dielectric layer formed on the semiconductor substrate; and a gate formed on the semiconductor substrate in a region defined by the inter-device isolation dielectric layer, wherein the gate comprises: spacers formed on the semiconductor substrate in a region defined by the inter-device isolation dielectric layer; a gate stack structure consisting of an interfacial oxide layer, a high-K dielectric layer, and a metal gate electrode, wherein the interfacial oxide layer is formed on the semiconductor substrate in a region between the spacers, the high-K dielectric layer is formed on the interfacial oxide layer, and the metal gate electrode is filled in a region defined by the high-K dielectric layer; and sacrificial oxygen-scavenging metal spacers formed on the semiconductor substrate in the inner periphery of the spacers and in the outer periphery of the high-K dielectric layer.

A sixth solution of the present invention provides a semiconductor device, comprising: a semiconductor substrate; a shallow trench isolation structure formed in the semiconductor substrate; an inter-device isolation dielectric layer formed on the semiconductor substrate; and a gate formed on the semiconductor substrate in a region defined by the inter-device isolation dielectric layer, wherein the gate comprises: spacers formed on the semiconductor substrate in the inter-device isolation dielectric layer; a gate stack structure consisting of an interfacial oxide layer, a high-K dielectric layer, and a metal gate electrode, wherein the interfacial oxide layer is formed on the semiconductor substrate in a region between the spacers, the high-K dielectric layer is formed on the interfacial oxide layer, and the metal gate electrode is filled in a region defined by the high-K dielectric layer; dielectric spacers formed on the semiconductor substrate in the inner periphery of the spacers and in the outer periphery of the high-K dielectric layer; and sacrificial oxygen-scavenging metal spacers formed on the dielectric spacers in the inner periphery of the dielectric spacers and in the outer periphery of the high-K dielectric layer.

Preferably, according to the fifth or sixth solution of the present invention, high-K dielectric spacers and the sacrificial oxygen-scavenging metal spacers are removed entirely or partially after oxygen-scavenging process; or high-K dielectric spacers, the sacrificial oxygen-scavenging metal spacers, and the dielectric spacers are removed entirely or partially after oxygen-scavenging process; or high-K dielectric spacers, the sacrificial oxygen-scavenging metal spacers, the dielectric spacers, and the spacers are removed entirely or partially after oxygen-scavenging process.

Preferably, the sacrificial oxygen-scavenging metal spacers are formed of Ta, Hf, or Ti; and/or the dielectric spacers are formed of $SiO_2$, $Si_3N_4$, or SiON.

Preferably, the sacrificial oxygen-scavenging metal spacers have a width of 1-10 nm, and a height of 20-90 nm, and/or the dielectric spacers have a width of 2-50 nm, and a height of 20-90 nm.

Preferably, the sacrificial oxygen-scavenging metal spacers have a simple D-shape section or an L-shape section.

Preferably, the dielectric spacers have an L-shape section.

According to the present invention, after the selective etching process, the sacrificial oxygen-scavenging metal spacers are formed in the outer periphery of the gate stack structure (the interfacial oxide layer, the high-K dielectric layer, and the metal gate electrode) and are arranged along the sidewall of the gate stack structure, acting as a sacrificial layer of the oxygen-scavenging process. In this way, disadvantages such as the EOT increasing and work function instability possibly caused by the conventional process can be overcome. Further, optionally, the sacrificial oxygen-scavenging metal spacers can be disposed between the gate stack structure and the dielectric spacers and has a simple D-shape or an L-shape section.

BRIEF DESCRIPTION OF THE DRAWINGS

Preferred embodiments of the present invention will be described with reference to the drawings, whereby the above and other objects, features and advantages will become apparent, wherein:

FIGS. 2-5 are schematic views of respective steps of the gate stack manufacturing method according to a first embodiment of the present invention, wherein FIG. 5 shows a semiconductor device obtained by the gate stack manufacturing method according to the first embodiment of the present invention.

FIGS. 2, 6, and 7 are schematic views of respective steps of the gate stack manufacturing method according to a second embodiment of the present invention, wherein FIG. 7 shows a semiconductor device obtained by the gate stack manufacturing method according to the second embodiment of the present invention.

FIGS. 8-12 are schematic views of respective steps of the gate stack manufacturing method according to a third embodiment of the present invention, wherein FIGS. 11 and 12 show semiconductor devices obtained by the gate stack manufacturing method according to the third embodiment of the present invention.

FIGS. 8 and 13-16 are schematic views of respective steps of the gate stack manufacturing method according to a fourth embodiment of the present invention, wherein FIGS. 15 and 16 show semiconductor devices obtained by the gate stack manufacturing method according to the fourth embodiment of the present invention.

It should be noted that the drawings are not drawn to scale and are only for illustration purpose. Therefore, the drawings should not be construed as any limit or constraint to the scope of the present invention. In the drawings, similar parts are referred to by similar reference numbers.

DETAILED DESCRIPTION OF THE PREFERRED EMBODIMENTS

The preferred embodiments of the present invention will be described in detail with reference to the drawings, wherein details and functions that are not crucial to the present invention are omitted, in order not to obscure the understanding to the present invention.

First Embodiment

Figure 5:
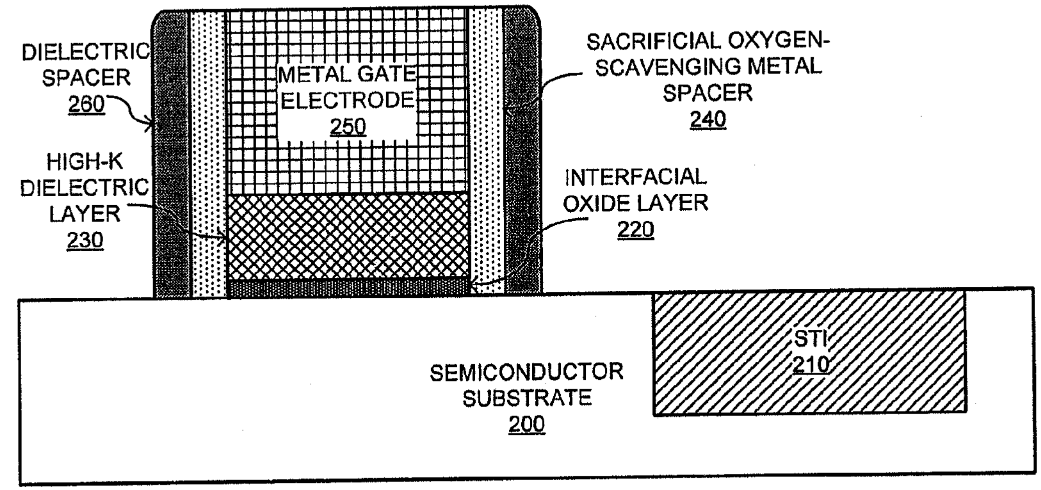

The semiconductor device manufactured by the gate stack manufacturing method according to the first embodiment of the present application is described with reference to FIG. 5. FIG. 5 is a schematic view of the semiconductor device obtained by the gate stack manufacturing method according to the first embodiment of the present invention.

As shown in FIG. 5, the semiconductor device obtained by the gate stack manufacturing method according to the first embodiment of the present invention mainly comprises: a semiconductor substrate 200, an STI (Shallow Trench Isolation) 210, an interfacial oxide layer 220, a high-K dielectric layer 230, a metal gate electrode 250, sacrificial oxygen-scavenging metal spacers 240, and dielectric spacers 260 (optional). The STI 210 is formed in the semiconductor substrate 200 for isolating the gate and the source/drain. The interfacial oxide layer 220 is formed on the semiconductor substrate 200. The high-K dielectric layer 230 is formed on the interfacial oxide layer 220. The metal gate electrode 250 is formed on the high-K dielectric layer 230. Thereby, the interfacial oxide layer 220, the high-K dielectric layer 230, and the metal gate electrode 250 form the gate stack structure of the semiconductor device. The sacrificial oxygen-scavenging metal spacers 240 is formed on the semiconductor substrate 200 and surrounds the gate stack structure in the outer periphery of the gate stack structure. The width of the sacrificial oxygen-scavenging metal spacers 240 in the horizontal direction shown in FIG. 5 is 1-10 nm. The height of the sacrificial oxygen-scavenging metal spacers 240 in the vertical direction shown in FIG. 5 is the same as that of the gate stack structure, i.e. in the range of 20-90 nm. The sacrificial oxygen-scavenging metal spacers 240 can be formed of Ta, Hf, or Ti. The optional dielectric spacers 260 are formed on the semiconductor substrate 200. The dielectric spacers 260 surround the sacrificial oxygen-scavenging metal spacers 240 in the outer periphery of the sacrificial oxygen-scavenging metal spacers 240 and have a width of 2-50 nm. The height of the dielectric spacers 260 is the same as that of the gate stack structure, i.e. in the range of 20-90 nm. The dielectric spacers 260 can be formed of $SiO_2$, $Si_3N_4$, or SiON. As shown in FIG. 5, the sacrificial oxygen-scavenging metal spacers 240 have a simple D-shape section.

According to this embodiment, after the selective etching process, the sacrificial oxygen-scavenging metal spacers 240 are formed in the outer periphery of the gate stack structure (the interfacial oxide layer 220, the high-K dielectric layer 230, and the metal gate electrode 250) and is arranged along the side wall of the gate stack structure after a selective etching process, acting as a sacrificial layer of the oxygen-scavenging process. In this way, disadvantages such as the EOT increasing and work function instability possibly caused by the conventional process can be overcome. Further, optionally, the sacrificial oxygen-scavenging metal spacers 240 can be disposed between the gate stack structure and the dielectric spacers 260 (which is formed after the formation of the sacrificial oxygen-scavenging metal spacers 240) and have a simple D-shape section.

Next, optionally, the sacrificial oxygen-scavenging metal spacers 240 and the dielectric spacers 260 can be selectively removed entirely (not shown) or partially (not shown) after the oxygen-scavenging process, whereby to obtain the gate stack structure (the interfacial oxide layer 220, the high-K dielectric layer 230, and the metal gate electrode 250) on the semiconductor substrate 200.

Next, the respective steps of the gate stack manufacturing method according to the first embodiment of the present invention will be described in detail with reference to FIGS. 2-5. As shown in FIGS. 2-5, the gate stack manufacturing method according to the first embodiment of the present invention is the Gate-First process.

Figure 1:
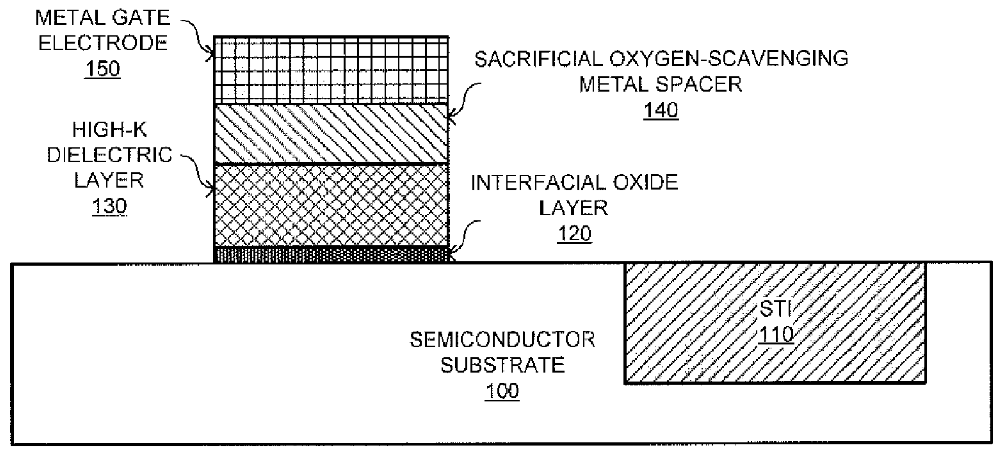
FIG. 1 is a schematic view of the semiconductor device manufactured by the conventional Gate-First process.
Figure 2:
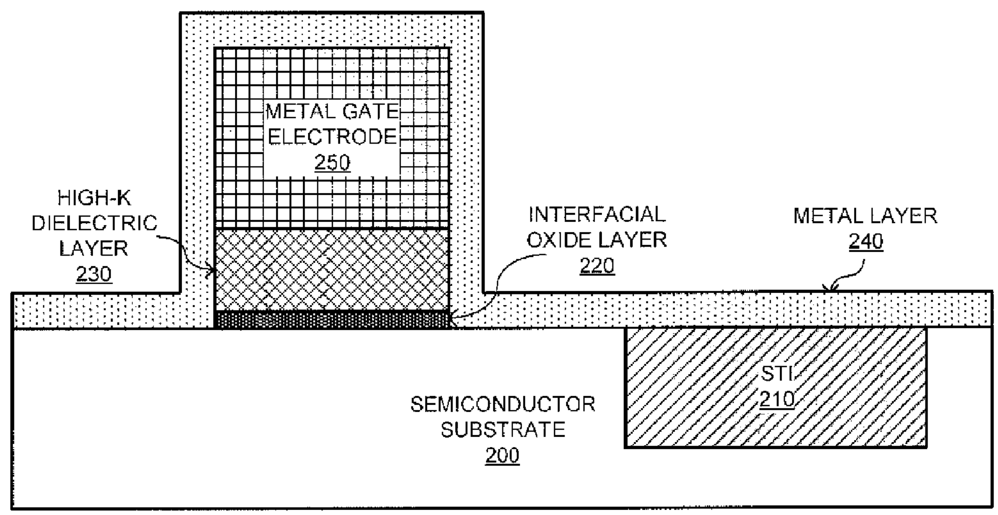

First, as shown in FIG. 2, after the STI 210 is formed in the semiconductor substrate 200 and the gate stack structure (consisting of the interfacial oxide layer 220, the high-K dielectric layer 230, and the metal gate electrode 250) is formed on the semiconductor substrate 200, a metal layer 240 having a thickness of 1-10 nm and consisting of Ta, Hf, or Ti is conformally deposited on the entire surface of the above structure, using the Gate-First process.

Figure 3:
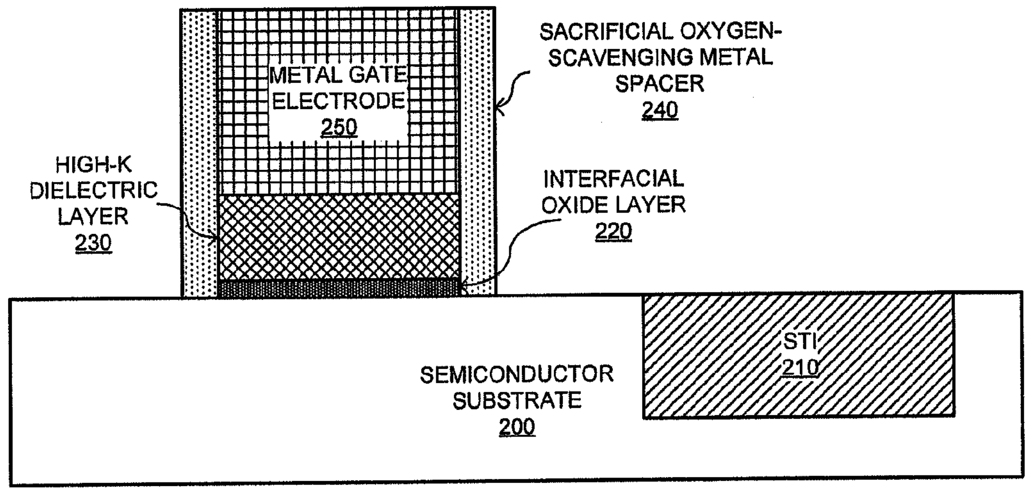

Then as shown in FIG. 3, the metal layer 240 is selectively etched to remove the metal layer 240 covering the metal gate electrode 250, the semiconductor substrate 200, and the STI 210, whereby only keeping the sacrificial oxygen-scavenging metal spacers 240 surrounding the gate stack structure in the outer periphery of the gate stack structure. Thus, the sacrificial oxygen-scavenging metal spacers 240 of the present invention are obtained.

Next, the step for forming the dielectric spacers 260 is optionally performed.

Figure 4:
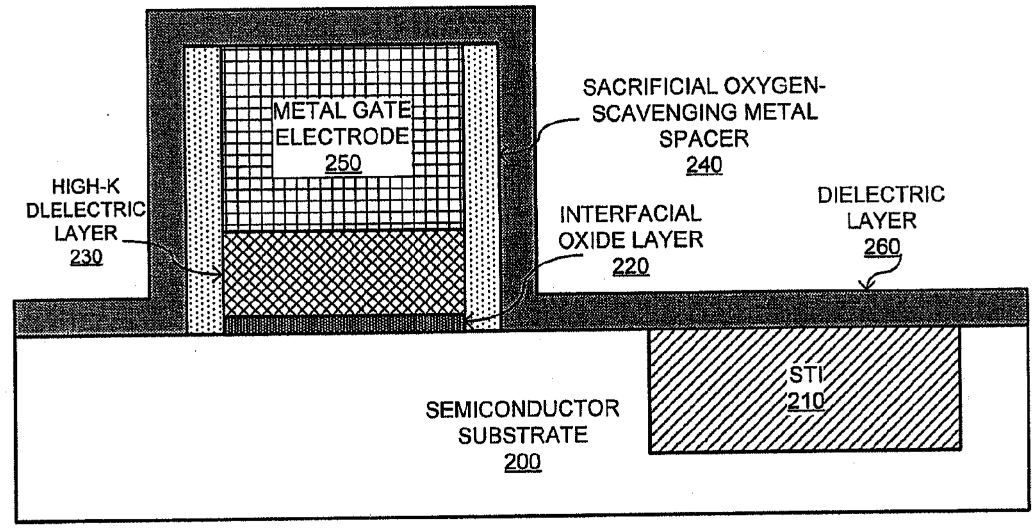

As shown in FIG. 4, the dielectric layer 260, which has a thickness of 2-50 nm and is formed of $SiO_2$, $Si_3N_4$, or SiON, is conformally deposited on the entire surface of the structure shown in FIG. 3.

Then as shown in FIG. 5, the dielectric layer 260 is processed by CMP or selective etching to remove the dielectric layer 260 covering the metal gate electrode 250, the top surfaces of the sacrificial oxygen-scavenging metal spacers 240, the semiconductor substrate 200 and the STI 210, whereby only keeping the dielectric spacers 260 surrounding the sacrificial oxygen-scavenging metal spacers 240 in the outer periphery of the sacrificial oxygen-scavenging metal spacers 240.

According to this embodiment, after the selective etching process, the sacrificial oxygen-scavenging metal spacers 240 are formed in the outer periphery of the gate stack structure (the interfacial oxide layer 220, the high-K dielectric layer 230, and the metal gate electrode 250) after a selective etching process, and is arranged along the side wall of the gate stack structure, acting as a sacrificial layer of the oxygen-scavenging process. In this way, disadvantages such as the EOT increasing and work function instability possibly caused by the conventional process can be overcome. Further, optionally, the sacrificial oxygen-scavenging metal spacers 240 can be disposed between the gate stack structure and the dielectric spacers 260 (which is formed after the formation of the sacrificial oxygen-scavenging metal spacers 240) and has a simple D-shape section.

Next, optionally, the sacrificial oxygen-scavenging metal spacers 240 and the dielectric spacers 260 can be selectively removed entirely (not shown) or partially (not shown) after the oxygen-scavenging process, whereby to obtain the gate stack structure (the interfacial oxide layer 220, the high-K dielectric layer 230, and the metal gate electrode 250) on the semiconductor substrate 200.

Second Embodiment

Figure 7:
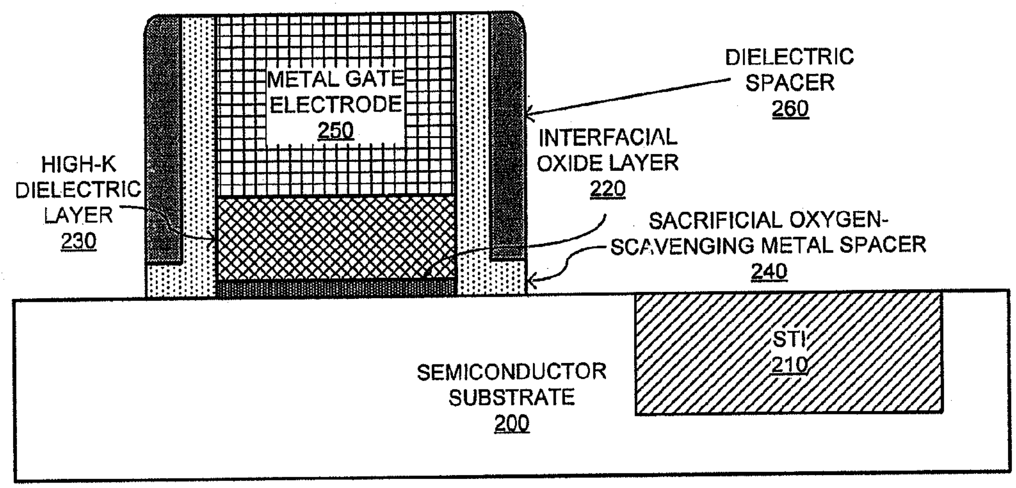

The semiconductor device manufactured by the gate stack manufacturing method according to the second embodiment of the present application is described with reference to FIG. 7. FIG. 7 is a schematic view of the semiconductor device obtained by the gate stack manufacturing method according to the second embodiment of the present invention.

As shown in FIG. 7, the semiconductor device obtained by the gate stack manufacturing method according to the second embodiment of the present invention mainly comprises: a semiconductor substrate 200, an STI (shallow trench isolation) 210, an interfacial oxide layer 220, a high-K dielectric layer 230, a metal gate electrode 250, sacrificial oxygen-scavenging metal spacers 240, and dielectric spacers 260. The STI 210 is formed in the semiconductor substrate 200 for isolation of devices. The interfacial oxide layer 220 is formed on the semiconductor substrate 200. The high-K dielectric layer 230 is formed on the interfacial oxide layer 220. The metal gate electrode 250 is formed on the high-K dielectric layer 230. Thereby, the interfacial oxide layer 220, the high-K dielectric layer 230, and the metal gate electrode 250 form the gate stack structure of the semiconductor device. The sacrificial oxygen-scavenging metal spacers 240 is formed on the semiconductor substrate 200 and surrounds the gate stack structure in the outer periphery of the gate stack structure. The width of sacrificial oxygen-scavenging metal spacers 240 in the horizontal direction shown in FIG. 7 is 1-10 nm. The height of the sacrificial oxygen-scavenging metal spacers 240 in the vertical direction shown in FIG. 7 is the same as that of the gate stack structure, i.e. in the range of 20-90 nm. The sacrificial oxygen-scavenging metal spacers 240 can be formed of Ta, Hf, or Ti. The dielectric spacers 260 are formed on the sacrificial oxygen-scavenging metal spacers 240 and surround the sacrificial oxygen-scavenging metal spacers 240 in the outer periphery of the sacrificial oxygen-scavenging metal spacers 240. The dielectric spacers 260 has a width of 2-50 nm. The height of the dielectric spacers 260 are the same as that of the gate stack structure, i.e. in the range of 20-90 nm. The dielectric spacers 260 can be formed of $SiO_2$, $Si_3N_4$, or SiON. As shown in FIG. 7, the sacrificial oxygen-scavenging metal spacers 240 have an L-shape section.

According to this embodiment, after the selective etching process, the sacrificial oxygen-scavenging metal spacers 240 are formed in the outer periphery of the gate stack structure (the interfacial oxide layer 220, the high-K dielectric layer 230, and the metal gate electrode 250) after a selective etching process, and is arranged along the side walls of the gate stack structure, acting as a sacrificial layer of the oxygen-scavenging process. In this way, disadvantages such as the EOT increasing and work function instability possibly caused by the conventional process can be overcome. Further, the sacrificial oxygen-scavenging metal spacers 240 can be disposed between the gate stack structure and the dielectric spacers 260, and has an L-shape section.

Next, optionally, the sacrificial oxygen-scavenging metal spacers 240 and the dielectric spacers 260 can be selectively removed entirely (not shown) or partially (not shown) after the oxygen-scavenging process, whereby to obtain the gate stack structure (the interfacial oxide layer 220, the high-K dielectric layer 230, and the metal gate electrode 250) on the semiconductor substrate 200.

Figure 6:
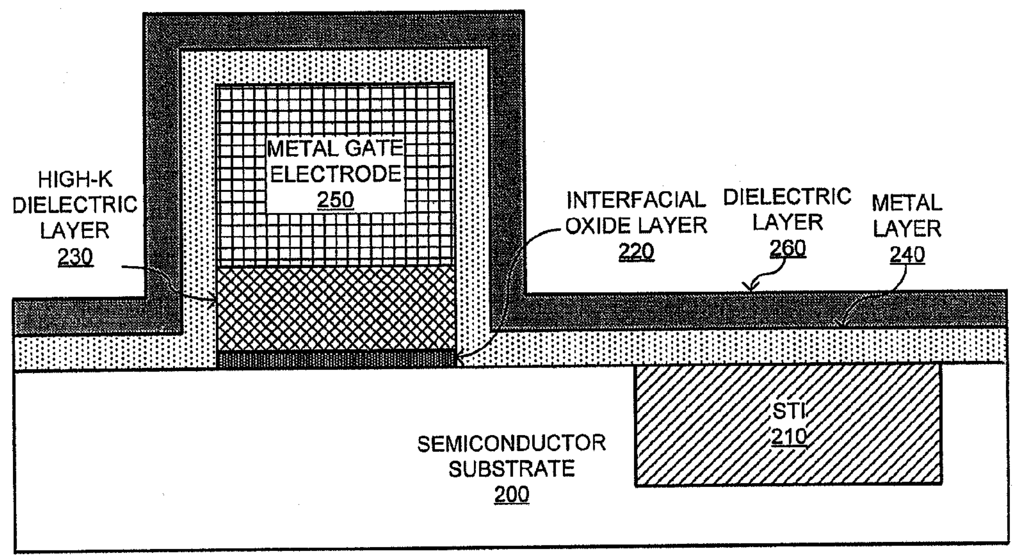

Next, the respective steps of the gate stack manufacturing method according to the second embodiment of the present invention will be described in detail with reference to FIGS. 2, 6, and 7. As shown in FIGS. 2, 6, and 7, the gate stack manufacturing method according to the second embodiment of the present invention is the Gate-First process.

First, as shown in FIG. 2, after the STI 210 is formed in the semiconductor substrate 200, and the gate stack structure (consisting of the interfacial oxide layer 220, the high-K dielectric layer 230, and the metal gate electrode 250) is formed on the semiconductor substrate 200, a metal layer 240 having a thickness of 1-10 nm and consisting of Ta, Hf, or Ti is conformally deposited on the entire surface of the above structure, using the Gate-First process.

Then as shown in FIG. 6, the dielectric layer 260, which has a thickness of 2-50 nm and is formed of $SiO_2$, $Si_3N_4$, or SiON, is conformally deposited on the entire surface of the structure shown in FIG. 2.

Then as shown in FIG. 7, the dielectric layer 260 and the metal layer 240 are sequentially processed by CMP or selective etching to remove the dielectric layer 260 and the metal layer 240 covering the metal gate electrode 250, the semiconductor substrate 200 and the STI 210, whereby only keeping the sacrificial oxygen-scavenging metal spacers 240 surrounding the gate stack structure in the outer periphery of the gate stack structure, and the dielectric spacers 260 surrounding the sacrificial oxygen-scavenging metal spacers 240 in the outer periphery of the sacrificial oxygen-scavenging metal spacers 240.

According to this embodiment, after the selective etching process, the sacrificial oxygen-scavenging metal spacers 240 are formed in the outer periphery of the gate stack structure (the interfacial oxide layer 220, the high-K dielectric layer 230, and the metal gate electrode 250) after a selective etching process, and is arranged along the side walls of the gate stack structure, acting as a sacrificial layer of the oxygen-scavenging process. In this way, disadvantages such as the EOT increasing and work function instability possibly caused by the conventional process can be overcome. Further, the sacrificial oxygen-scavenging metal spacers 240 can be disposed between the gate stack structure and the dielectric spacers 260 and have an L-shape section.

Next, optionally, the sacrificial oxygen-scavenging metal spacers 240 and the dielectric spacers 260 can be selectively removed entirely (not shown) or partially (not shown) after the oxygen-scavenging process, whereby to obtain the gate stack structure (the interfacial oxide layer 220, the high-K dielectric layer 230, and the metal gate electrode 250) on the semiconductor substrate 200.

Third Embodiment

Figure 11:
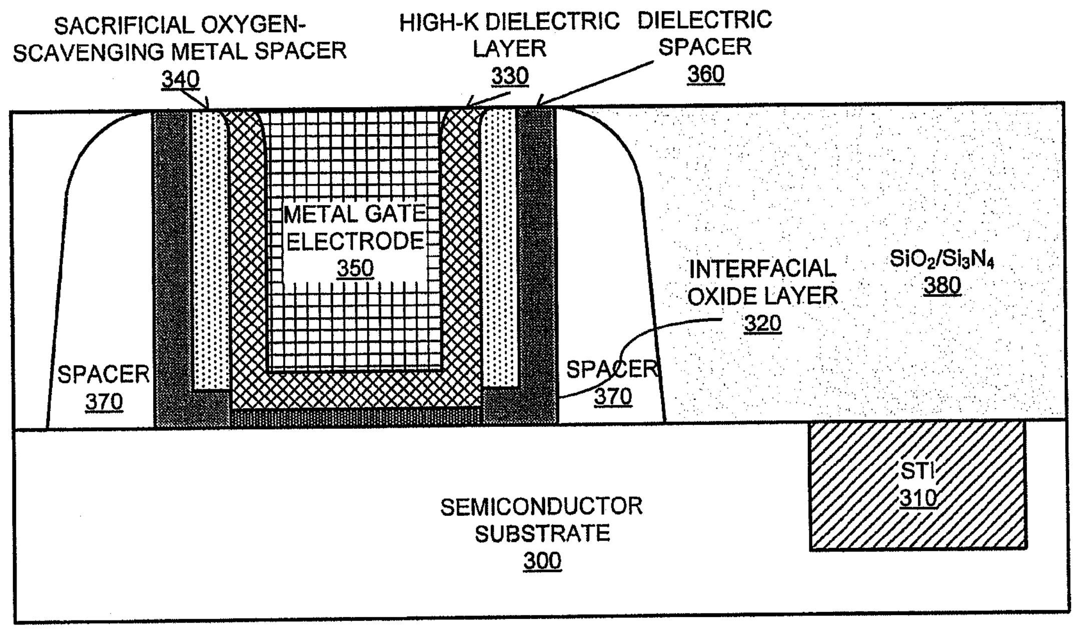
Figure 12:
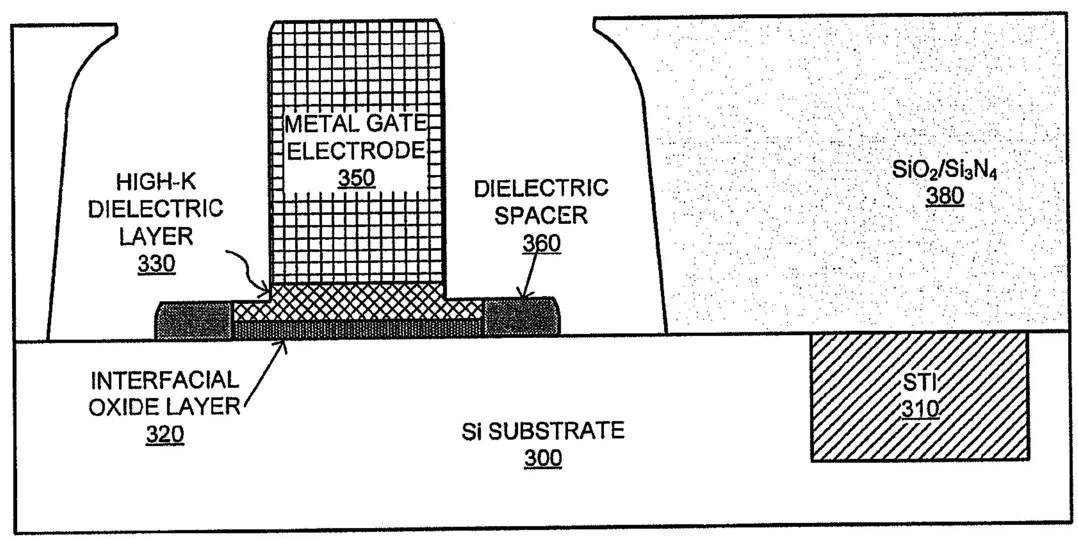

The semiconductor device manufactured by the gate stack manufacturing method according to the third embodiment of the present application is described with reference to FIGS. 11 and 12. FIGS. 11 and 12 are schematic views of the semiconductor devices obtained by the gate stack manufacturing method according to the third embodiment of the present invention.

As shown in FIG. 11, the semiconductor device obtained by the gate stack manufacturing method according to the third embodiment of the present invention mainly comprises: a semiconductor substrate 300, an STI (shallow trench isolation) 310, an interfacial oxide layer 320, a high-K dielectric layer 330, a metal gate electrode 350, sacrificial oxygen-scavenging metal spacers 340, dielectric spacers 360, spacers 370, and an inter-device isolation dielectric layer ($SiO_2$/$Si_3N_4$) 380. The STI 310 is formed in the semiconductor substrate 300 for isolating the gate and the source/drain. The interfacial oxide layer 320, the high-K dielectric layer 330, the metal gate electrode 350, the sacrificial oxygen-scavenging metal spacers 340, the dielectric spacers 360, and the spacers 370 are all formed in the inter-device isolation dielectric layer ($SiO_2$/$Si_3N_4$) 380. The interfacial oxide layer 320, the dielectric spacers 360, and the spacers 370 are formed on the semiconductor substrate 300. The dielectric spacers 360 are in the inner periphery of the spacers 370. The width of the dielectric spacers 360 in a horizontal direction shown in FIG. 11 is 2-50 nm. The height of the dielectric spacers 360 in the vertical direction shown in FIG. 11 is 20-90 nm. The dielectric spacers 360 can be formed of $SiO_2$, $Si_3N_4$, or SiON. The interfacial oxide layer 320 is formed in a region surrounded by the dielectric spacers 360. The sacrificial oxygen-scavenging metal spacers 340 are in the inner periphery of the dielectric spacers 360 and are formed on the dielectric spacers 360. The width of the sacrificial oxygen-scavenging metal spacers 340 in the horizontal direction shown in FIG. 11 is 1-10 nm. The height of the sacrificial oxygen-scavenging metal spacers 340 in the vertical direction shown in FIG. 11 is 20-90 nm. The sacrificial oxygen-scavenging metal spacers 340 can be formed of Ta, Hf, or Ti. The high-K dielectric layer 330 is in the inner periphery of the sacrificial oxygen-scavenging metal spacers 340, and is formed on the interfacial oxide layer 320. The metal gate electrode 350 is filled in a region defined by the high-K dielectric layer 330. In this way, the interfacial oxide layer 320, the high-K dielectric layer 330, and the metal gate electrode 350 form the gate stack structure of the semiconductor device. As shown in FIG. 11, the dielectric spacers 360 have an L-shape section.

According to this embodiment, after the selective etching process, the sacrificial oxygen-scavenging metal spacers 340 are formed in the outer periphery of the high-K dielectric layer 330, and are arranged along the side walls of the gate stack structure, acting as a sacrificial layer of the oxygen-scavenging process. In this way, disadvantages such as the EOT increasing and work function instability possibly caused by the conventional process can be overcome. Further, the sacrificial oxygen-scavenging metal spacers 340 are disposed between the gate stack structure and the dielectric spacers 360, and the dielectric spacers 360 have an L-shape section.

Next, optionally, as shown in FIG. 12, the high-K dielectric spacers 330, the sacrificial oxygen-scavenging metal spacers 340, the dielectric spacers 360, and the spacer 370 can be selectively removed entirely (not shown) or partially (the high-K dielectric layer 330 and the dielectric spacers 360 can be partially kept to prevent the semiconductor device form being damaged) after the oxygen-scavenging process, whereby to obtain the gate stack structure (the interfacial oxide layer 320, the high-K dielectric layer 330, and the metal gate electrode 350) in the cavity of the inter-device isolation dielectric layer 380.

Next, the respective steps of the gate stack manufacturing method according to the third embodiment of the present invention will be described in detail with reference to FIGS. 8-12. As shown in FIGS. 8-12, the gate stack manufacturing method according to the third embodiment of the present invention is the Gate-Last process.

Figure 8:
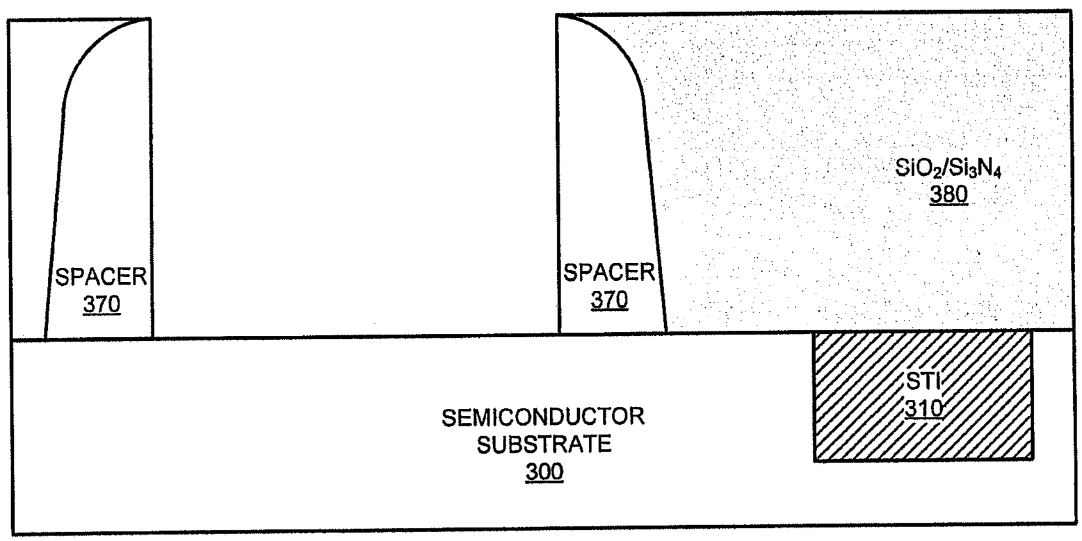

First, as shown in FIG. 8, the replacement gate stack is removed to expose the semiconductor substrate 300.

Figure 9:
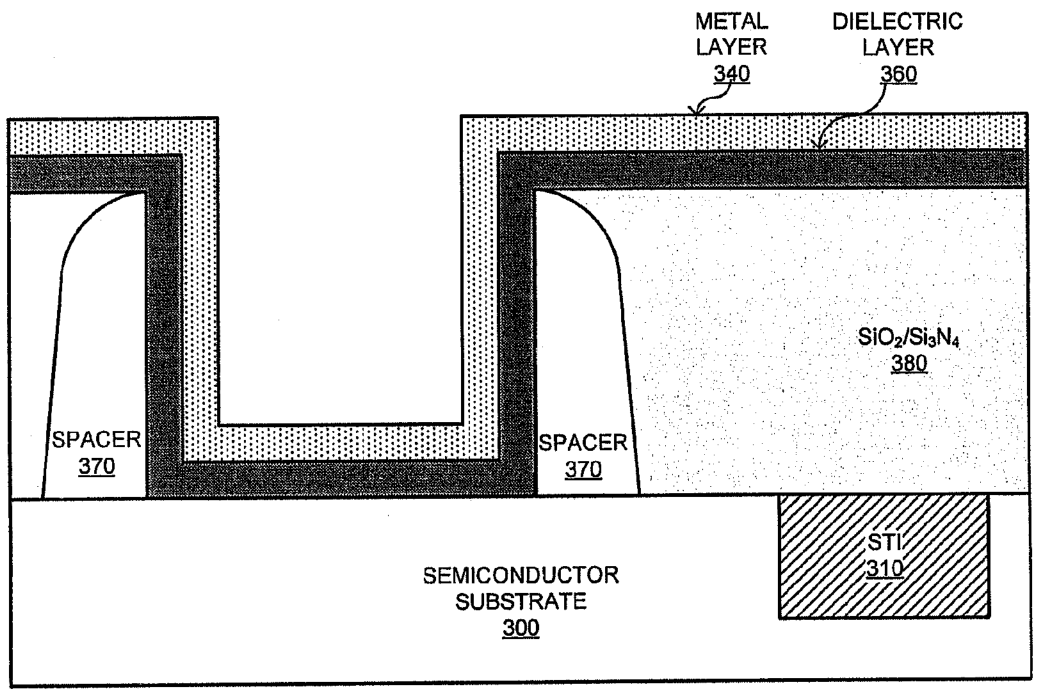

Next, as shown in FIG. 9, the dielectric spacers 360 having a thickness of 2-50 nm and consisting of $SiO_2$, $Si_3N_4$, or SiCN, and a metal layer 340 having a thickness of 1-10 nm and consisting of Ta, Hf, or Ti, are conformally deposited on the entire surface of the structure shown in FIG. 8 in this order.

Figure 10:
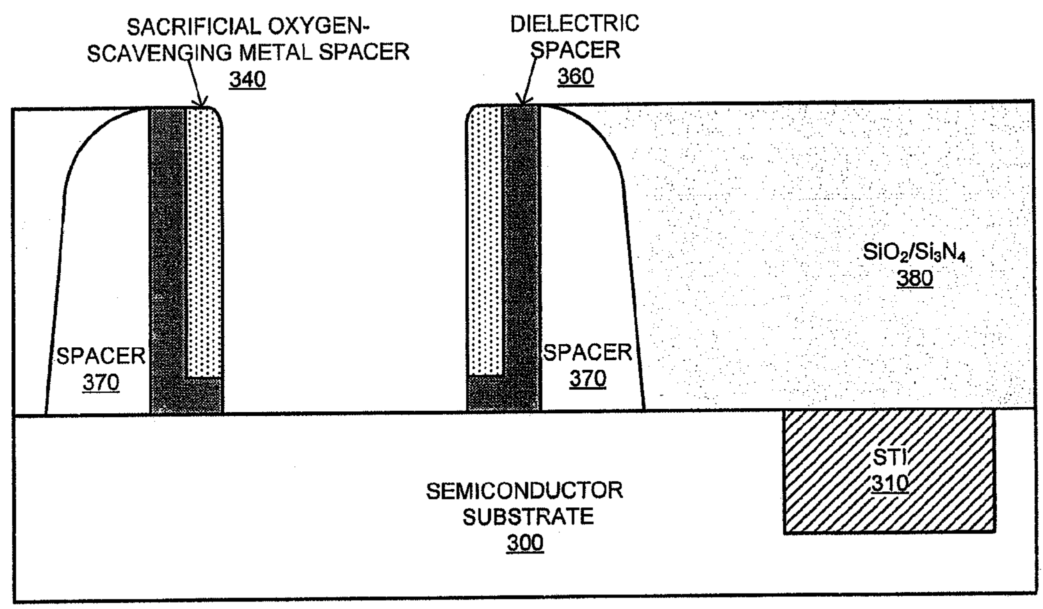

Next, as shown in FIG. 10, the metal layer 340 and the dielectric spacers 360 are sequentially processed by selective etching, to remove the metal layer 340 and the dielectric spacers 360 both covering the inter-device isolation dielectric layer 380 and the semiconductor substrate 300, such that only the dielectric spacers 360 in the inner periphery of spacers 370 and the sacrificial oxygen-scavenging metal spacers 340 in the inner periphery of the dielectric spacers 360 are kept.

Then, as shown in FIG. 11, the interfacial oxide layer 320, the high-K dielectric layer 330, and the metal gate electrode 350 are sequentially formed on the semiconductor substrate 300 between the sacrificial oxygen-scavenging metal spacers 340. Thus, the gate stack structure with the sacrificial oxygen-scavenging metal spacers 340 is formed.

According to this embodiment, after the selective etching process, the sacrificial oxygen-scavenging metal spacers 340 are formed in the outer periphery of the high-K dielectric layer 330, and are arranged along the side walls of the gate stack structure, acting as a sacrificial layer of the oxygen-scavenging process. In this way, disadvantages such as the EOT increasing and work function instability possibly caused by the conventional process can be overcome. Further, the sacrificial oxygen-scavenging metal spacers 340 are disposed between the gate stack structure and the dielectric spacers 360, and the dielectric spacers 360 have an L-shape section.

Finally, as shown in FIG. 12, optionally, the high-K dielectric spacers 330, the sacrificial oxygen-scavenging metal spacers 340, the dielectric spacers 360, and the spacer 370 can be selectively removed entirely (not shown) or partially (the high-K dielectric layer 330 and the dielectric spacers 360 can be partially kept to prevent the semiconductor device form being damaged) after the oxygen-scavenging process, whereby to obtain the gate stack structure (the interfacial oxide layer 320, the high-K dielectric layer 330, and the metal gate electrode 350) in the cavity of the inter-device isolation dielectric layer 380.

Fourth Embodiment

Figure 15:
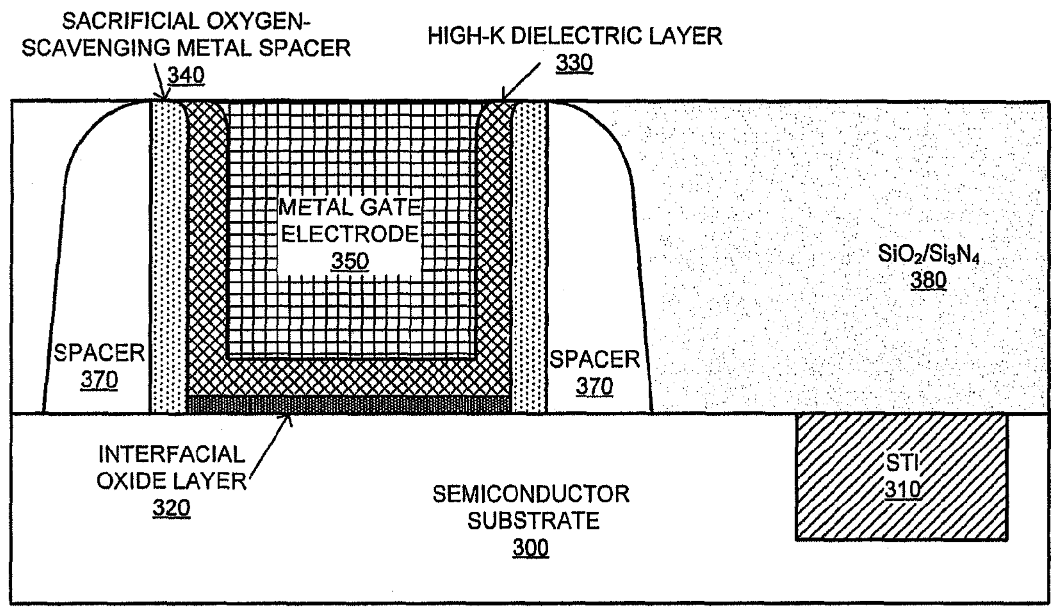
Figure 16:
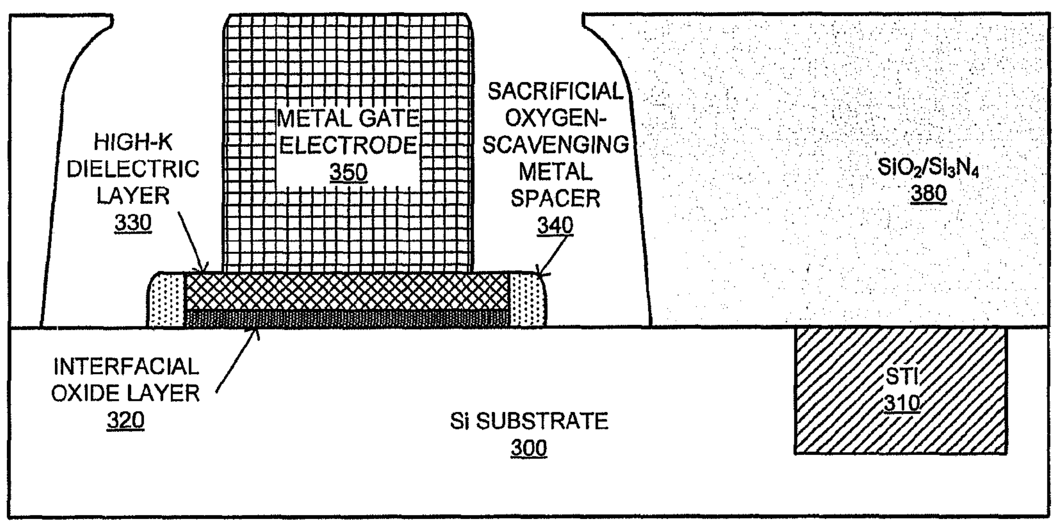

The semiconductor device manufactured by the gate stack manufacturing method according to the fourth embodiment of the present application is described with reference to FIGS. 15 and 16. FIGS. 15 and 16 are schematic views of the semiconductor devices obtained by the gate stack manufacturing method according to the fourth embodiment of the present invention.

As shown in FIG. 15, the semiconductor device obtained by the gate stack manufacturing method according to the fourth embodiment of the present invention mainly comprises: a semiconductor substrate 300, an STI (shallow trench isolation) 310, an interfacial oxide layer 320, a high-K dielectric layer 330, a metal gate electrode 350, sacrificial oxygen-scavenging metal spacers 340, a spacer 370, and an inter-device isolation dielectric layer ($SiO_2/Si_3N_4$) 380. The STI 310 is formed in the semiconductor substrate 300 for isolating the gate and the source/drain. The interfacial oxide layer 320, the high-K dielectric layer 330, the metal gate electrode 350, the sacrificial oxygen-scavenging metal spacers 340, and the spacer 370 are all formed in the inter-device isolation dielectric layer ($SiO_2/Si_3N_4$) 380. The interfacial oxide layer 320, the sacrificial oxygen-scavenging metal spacers 340, and the spacer 370 are formed on the semiconductor substrate 300. The sacrificial oxygen-scavenging metal spacers 340 are formed on the interfacial oxide layer 320 in the inner periphery of the spacer 370. The width of the sacrificial oxygen-scavenging metal spacers 340 in the horizontal direction shown in FIG. 15 is 1-10 nm. The height of the sacrificial oxygen-scavenging metal spacers 340 in the vertical direction shown in FIG. 15 is 20-90 nm. The sacrificial oxygen-scavenging metal spacers 340 can be formed of Ta, Hf, or Ti. The interfacial oxide layer 320 is formed in a region surrounded by the sacrificial oxygen-scavenging metal spacers 340. The high-K dielectric layer 330 is formed in the inner periphery of the sacrificial oxygen-scavenging metal spacers 340 on the dielectric spacers 360. The metal gate electrode 350 is filled in a region defined by the high-K dielectric layer 330. In this way, the interfacial oxide layer 320, the high-K dielectric layer 330, and the metal gate electrode 350 form the gate stack structure of the semiconductor device. As shown in FIG. 15, the sacrificial oxygen-scavenging metal spacers 340 have a D-shape section.

According to this embodiment, after the selective etching process, the sacrificial oxygen-scavenging metal spacers 340 are formed in the outer periphery of the high-K dielectric layer 330, and are arranged along the side walls of the gate stack structure, acting as a sacrificial layer of the oxygen-scavenging process. In this way, disadvantages such as the EOT increasing and work function instability possibly caused by the conventional process can be overcome. Further, the sacrificial oxygen-scavenging metal spacers 340 have a simple D-shape section.

Next, optionally, as shown in FIG. 16, the high-K dielectric spacers 330, the sacrificial oxygen-scavenging metal spacers 340, and the spacer 370 can be selectively removed entirely (not shown) or partially (the high-K dielectric layer 330 and the sacrificial oxygen-scavenging metal spacers 340 can be partially kept to prevent the semiconductor device form being damaged) after the oxygen-scavenging process, whereby to obtain the gate stack structure (the interfacial oxide layer 320, the high-K dielectric layer 330, and the metal gate electrode 350) in the cavity of the inter-device isolation dielectric layer 380.

Next, the respective steps of the gate stack manufacturing method according to the fourth embodiment of the present invention will be described in detail with reference to FIGS. 8 and 13-16. As shown in FIGS. 8 and 13-16, the gate stack manufacturing method according to the fourth embodiment of the present invention is the Gate-Last process.

First, as shown in FIG. 8, the replacement gate stack is removed to expose the semiconductor substrate 300.

Figure 13:
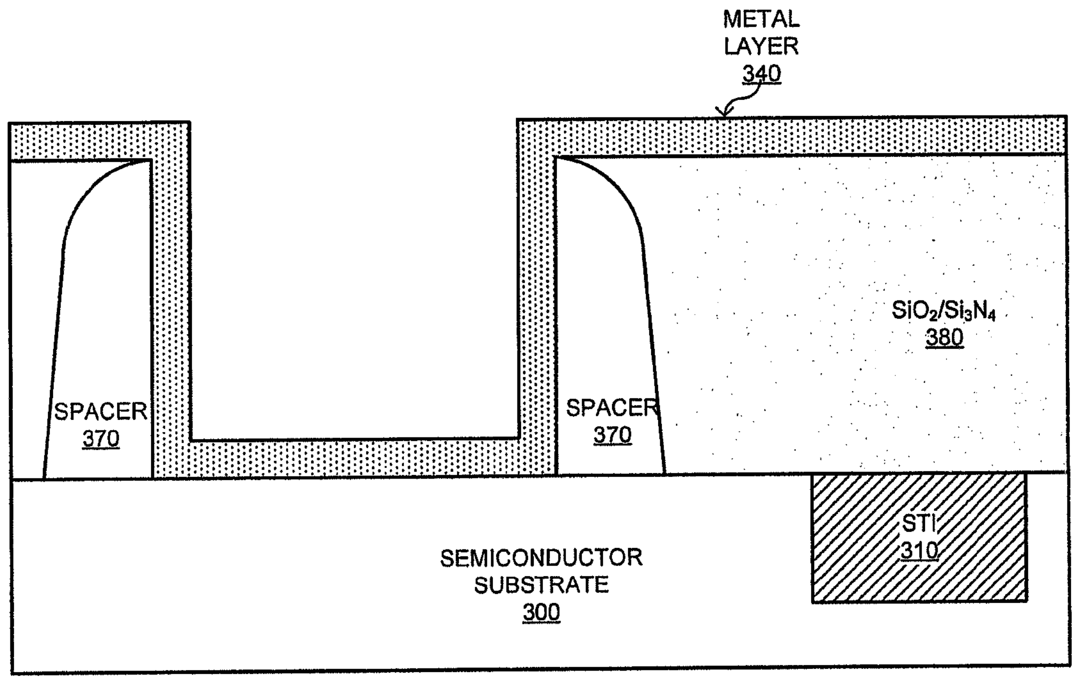

Next, as shown in FIG. 13, a metal layer 340 having a thickness of 1-10 nm and consisting of Ta, Hf, or Ti is conformally deposited on the entire surface of the structure shown in FIG. 8 in this order.

Figure 14:
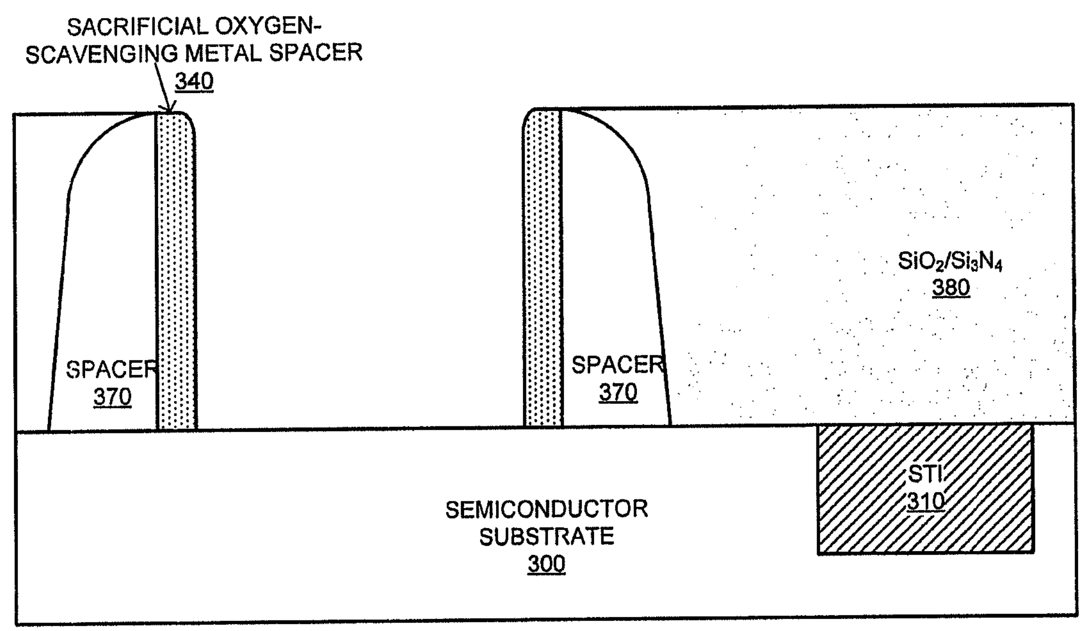

Next, as shown in FIG. 14, the metal layer 340 is processed by selective etching to remove the metal layer 340 covering both the inter-device isolation dielectric layer 380 and the semiconductor substrate 300, such that only the sacrificial oxygen-scavenging metal spacers 340 in the inner periphery of the spacer 370 are kept.

Then, as shown in FIG. 15, the interfacial oxide layer 320, the high-K dielectric layer 330, and the metal gate electrode 350 are sequentially formed on the semiconductor substrate 300 between the sacrificial oxygen-scavenging metal spacers 340. Thus, the gate stack structure with the sacrificial oxygen-scavenging metal spacers 340 is formed.

According to this embodiment, after the selective etching process, the sacrificial oxygen-scavenging metal spacers 340 are formed in the outer periphery of the high-K dielectric layer 330, and are arranged along the side walls of the gate stack structure, acting as a sacrificial layer of the oxygen-scavenging process. In this way, disadvantages such as the EOT increasing and work function instability possibly caused by the conventional process can be overcome. Further, the sacrificial oxygen-scavenging metal spacers 340 have a simple D-shape section.

Finally, as shown in FIG. 16, optionally, the high-K dielectric spacers 330, the sacrificial oxygen-scavenging metal spacers 340, and the spacer 370 can be selectively removed entirely (not shown) or partially (the high-K dielectric layer 330 and the sacrificial oxygen-scavenging metal spacers 340 can be partially kept to prevent the semiconductor device form being damaged) after the oxygen-scavenging process, whereby to obtain the gate stack structure (the interfacial oxide layer 320, the high-K dielectric layer 330, and the metal gate electrode 350) in the cavity of the inter-device isolation dielectric layer 380.

The present invention has been described in connection with preferred embodiments. It should be understood that those skilled in the art can make various other changes, alternations, and supplementations without departing the spirit and scope of the present invention. Therefore, the scope of the present invention is not limited to the above specific embodiments, but is defined by the following claims.

What is claimed is:

1. A manufacturing method of a gate stack with sacrificial oxygen-scavenging metal spacers, comprising:

removing a replacement gate stack formed in an inter-device isolation dielectric layer to expose the top surface of a semiconductor substrate and sidewalls of spacers within the inter-device isolation dielectric layer;

conformally depositing a metal layer covering the inter-device isolation dielectric layer and the semiconductor substrate;

selectively etching the metal layer to remove the portions of the metal layer covering the inter-device isolation dielectric layer and the semiconductor substrate to form sacrificial oxygen-scavenging metal spacers, and only keeping the sacrificial oxygen-scavenging metal spacers in the inner periphery of the spacers; and sequentially forming an interfacial oxide layer, a high-K dielectric layer, and a metal gate electrode on the semiconductor substrate filling the space between the sacrificial oxygen-scavenging metal spacers, so as to form a gate stack structure.

2. The manufacturing method of a gate stack with sacrificial oxygen-scavenging metal spacers according to claim 1, further comprising one of the following steps:

entirely or partially removing high-K dielectric spacers formed from the high-K dielectric layer and the sacrificial oxygen-scavenging metal spacers after oxygen-scavenging process; or entirely or partially removing high-K dielectric spacers formed from the high-K dielectric layer, the sacrificial oxygen-scavenging metal spacers, and the spacers after oxygen-scavenging process.

3. A manufacturing method of a gate stack with sacrificial oxygen-scavenging metal spacers, comprising:

removing a replacement gate stack formed in an inter-device isolation dielectric layer to expose the top of a semiconductor substrate and sidewalls of spacers in the inter-device isolation dielectric layer;

conformally depositing a dielectric layer covering the inter-device isolation dielectric layer and the semiconductor substrate;

conformally depositing a metal layer covering the dielectric layer;

selectively etching the metal layer and the dielectric layer sequentially to remove the metal layer and the dielectric layer covering the inter-device isolation dielectric layer and the semiconductor substrate to form sacrificial oxygen-scavenging metal spacers and dielectric spacers, so as to only keep the dielectric spacers in the inner periphery of the spacers and the sacrificial oxygen-scavenging metal spacers in the inner periphery of the dielectric spacers; and sequentially forming an interfacial oxide layer, a high-K dielectric layer, and a metal gate electrode filling the space between the sacrificial oxygen-scavenging metal spacers on the semiconductor substrate.

4. The manufacturing method of a gate stack with sacrificial oxygen-scavenging metal spacers according to claim 3, further comprising one of the following steps:

entirely or partially removing high-K dielectric spacers formed from the high-K dielectric layer, the sacrificial oxygen-scavenging metal spacers, and the dielectric spacers after oxygen-scavenging process; or entirely or partially removing high-K dielectric spacers formed from the high-K dielectric layer, the sacrificial oxygen-scavenging metal spacers, the dielectric spacers, and the spacers after oxygen-scavenging process.

5. A semiconductor device, comprising:

a semiconductor substrate;

a shallow trench isolation structure formed in the semiconductor substrate;

an inter-device isolation dielectric layer formed on the semiconductor substrate; and a gate formed on the semiconductor substrate in a region defined by the inter-device isolation dielectric layer, wherein the gate comprises:

spacers formed on the semiconductor substrate in the inter-device isolation dielectric layer;

a gate stack structure consisting of an interfacial oxide layer, a high-K dielectric layer, and a metal gate electrode, wherein the interfacial oxide layer is formed on the semiconductor substrate in a region between the spacers, the high-K dielectric layer is formed on the interfacial oxide layer, and the metal gate electrode is filled in a region defined by the high-K dielectric layer;

dielectric spacers formed on the semiconductor substrate in the inner periphery of the spacers and in the outer periphery of the high-K dielectric layer; and sacrificial oxygen-scavenging metal spacers formed on the dielectric spacers in the inner periphery of the dielectric spacers and in the outer periphery of the high-K dielectric layer.

6. The semiconductor device according to claim 5, wherein:

high-K dielectric spacers formed from the high-K dielectric layer, the sacrificial oxygen-scavenging metal spacers, and the dielectric spacers are removed entirely or partially after oxygen-scavenging process; or high-K dielectric spacers formed from the high-K dielectric layer, the sacrificial oxygen-scavenging metal spacers, the dielectric spacers, and the spacers are removed entirely or partially after oxygen-scavenging process.

* * * * *